United States Patent
Tan et al.

(10) Patent No.: US 7,172,017 B2
(45) Date of Patent: Feb. 6, 2007

(54) HEAT SINK

(75) Inventors: Li-Kuang Tan, Taoyuan Hsien (TW);
Yu-Hung Huang, Ilan Hsien (TW);
Wei-Fan Wu, Taichung Hsien (TW);
Kuo-Cheng Lin, Taoyuan Hsien (TW);
Wen-Shi Huang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 232 days.

(21) Appl. No.: 10/339,488

(22) Filed: Jan. 10, 2003

(65) Prior Publication Data

US 2004/0011508 A1    Jan. 22, 2004

(30) Foreign Application Priority Data

Jul. 16, 2002    (TW)    ............... 91210818 U

(51) Int. Cl.
*H05K 7/20* (2006.01)
(52) U.S. Cl. .................... 165/185; 165/80.3; 257/720; 257/722; 361/704
(58) Field of Classification Search ............... 165/80.3, 165/121, 122, 185; 257/720, 722; 361/697, 361/704
See application file for complete search history.

(56) References Cited

U.S. PATENT DOCUMENTS

| | | | | |
|---|---|---|---|---|
| 3,219,885 A | * | 11/1965 | Schniers | .................... 165/80.3 |
| 4,715,438 A | * | 12/1987 | Gabuzda et al. | ............. 165/185 |
| 4,823,869 A | * | 4/1989 | Arnold et al. | ............... 165/185 |
| 4,918,571 A | * | 4/1990 | Grabbe | ........................ 257/722 |
| 4,997,034 A | * | 3/1991 | Steffen et al. | ............... 165/185 |
| 5,132,780 A | * | 7/1992 | Higgins, III | ................. 257/722 |
| 5,597,034 A | * | 1/1997 | Barker, III et al. | ......... 165/80.3 |
| 6,085,833 A | * | 7/2000 | Kimura et al. | .............. 165/185 |
| 6,196,300 B1 | * | 3/2001 | Checchetti | .................. 165/80.3 |
| 6,446,707 B1 | * | 9/2002 | White | ........................ 165/80.3 |
| 6,517,218 B2 | * | 2/2003 | Hochstein | .................... 361/704 |
| 6,552,902 B2 | * | 4/2003 | Cho et al. | ..................... 361/704 |
| 6,621,699 B2 | * | 9/2003 | Watanabe et al. | ........... 361/697 |
| 6,691,768 B2 | * | 2/2004 | Hsieh et al. | ................ 165/80.3 |

* cited by examiner

*Primary Examiner*—Leonard R. Leo
(74) *Attorney, Agent, or Firm*—Birch, Stewart, Kolasch & Birch, LLP

(57) ABSTRACT

This specification discloses a heat sink for coolers. The heat sink contains a heat conductive element, a heat dissipating shell covering over the heat conductive element, and a plurality of heat dissipating fins installed on the heat dissipating shell. The heat conductive element is comprised of a heat conductive plate and a heat conductive block installed at the center thereof. The area of the lower surface of the heat conductive block is greater than that of the upper surface thereof. When the lower surface of the heat conductive plate is in contact with a device that needs heat dissipation, the heat conductive block increases the heat conducting volume at the center of the heat conductive plate, so that the heat produced by the device can be released at an optimal rate.

13 Claims, 12 Drawing Sheets

HEAT SINK

BACKGROUND OF THE INVENTION

1. Field of Invention

The invention relates to an improved heat sink and, in particular, to a heat sink with a heat dissipating base that has a three-dimensional curved surface.

2. Related Art

With the increasing efficiency of electronic devices, the heat dissipating device or system becomes indispensable equipment. If the heat produced by an electronic device is not released to the environment properly, the efficiency may deteriorate or the device may burn out. Therefore, the heat dissipating device is of particular importance to microelectronic devices (e.g. IC). With the increase in the density of elements and advance in the packaging technology, the IC's have even smaller areas. At the same time, the heat accumulated in each unit area grows. Therefore, highly efficient heat sinks always form an important research subject in the electronics industry.

Generally speaking, the heat dissipating device is installed on the surface of a heat-generating device to remove the heat form the device. According to the shape of the base, the heat dissipating devices can be categorized as planar and cylindrical ones.

Please refer to FIGS. 1, 2 and 3. FIG. 1 is a schematic view of the conventional heat 3 is a side view of the planar heat sink 20 along the 3—3 cross section. As shown in these drawings, the heat dissipating device 10 includes an axial-flow fan 12 and a planar heat sink 20. The planar heat sink 20 has a copper or copper alloy heat conductive plate 24, an aluminum or aluminum alloy heat dissipating shell 26 covering over the heat conductive plate 24, and a plurality of aluminum or aluminum alloy heat dissipating fins 22 perpendicularly installed on the heat dissipating shell 26. The fan 12 is embedded and fixed on the fins 22 of the heat sink 20. The lower surface of the heat conductive plate 24 is attached onto a heat-producing device (e.g. a CPU, not shown in the drawing).

The heat-producing device releases a lot of heat during operations. Since copper has an extremely good heat conductive property, the released heat rapidly flows toward the heat dissipating shell 26 and to the fins 22 through the heat conductive plate 24. The fan 12 further blows the heat on the fins 22 away, thereby achieving the heat dissipation effect. However, the produced heat forms a heat flow field (see FIG. 3) within the heat conductive plate 24. This results in a worse heat conductive effect in the central area of the base 24. Moreover, the position that generates the most heat in a typical heat-producing device is the central region. Therefore, the central area of the heat conductive plate 24 in the planar heat sink 20 requires a better heat conducting element to enhance the dissipation effect.

To improve the heat dissipation effect in the central region of the heat conductive plate 24, a cylindrical heat sink is proposed in the prior art. Please refer to FIGS. 4, 5 and 6. FIG. 4 shows another conventional heat dissipating device 30. FIG. 5 is a top view of the cylindrical heat sink 40 in FIG. 4. FIG. 6 is a side view of the cylindrical heat sink 40 along the 6—6 cross section. As shown in the drawings, the heat dissipating device 30 contains an axial-flow fan 12 (same as in FIG. 1) and a cylindrical heat sink 40. The cylindrical heat sink 40 is comprised of a copper or copper alloy heat conductive cylinder 44, an aluminum or aluminum alloy heat dissipating shell 46 covering over the rim of the heat conductive cylinder 44, and a plurality of aluminum or aluminum alloy fins 42 perpendicularly installed on the shell 46. Analogously, the fan 12 is embedded and fixed on the fins 42 of the heat sink 40. The other surface of the heat sink 40 is then attached onto the heat-producing device (e.g. CPU).

As the heat-producing device is in direct contact with the heat sink surface 40, the heat released during the operation of the heat-producing device quickly flows to the heat conductive cylinder 44, the heat dissipating shell 46, and the fins 42. Through the cylindrical design, the heat flows along the heat conductive cylinder 44, the shell 46, and the fins 42 in the axial direction toward to fan 12. The fan then provides air convection to bring out the heat.

From the above description, one sees that the cylindrical heat sink 40 indeed solves the unsatisfactory heat dissipation effect in the central region of the planar heat sink 20. However, it is easily seen from the heat flow field in FIG. 6 that the region close to the connection interface between the heat sink 40 and the fan 12 does not have a good dissipation effect. This obviously is a waste of available space in the heat dissipating device 30. It is very unpractical to use such devices in small electronics.

Furthermore, the heat conductive plate 24 of the heat sink 20 and the heat conductive cylinder 44 of the heat sink 40 are connected to the heat dissipating shell 26, 46 by soldering, bonding, or high-pressure mounting, respectively. If the precision of the heat conductive plate 24, he heat conductive cylinder 44, and the heat sinks 26, 46 is not high enough, air gaps may appear at the connection interfaces. Besides, soldering often increases the thermal resistance of the contact interface, also affecting the heat conduction effect of the heat sinks 20, 40.

SUMMARY OF THE INVENTION

The invention provides an improved heat sink with a heat dissipating base that has a three-dimensional curved surface. By tight connection between the heat dissipating base and the heat dissipating shell using the disclosed connector, an optimal heat conduction effect can be achieved.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
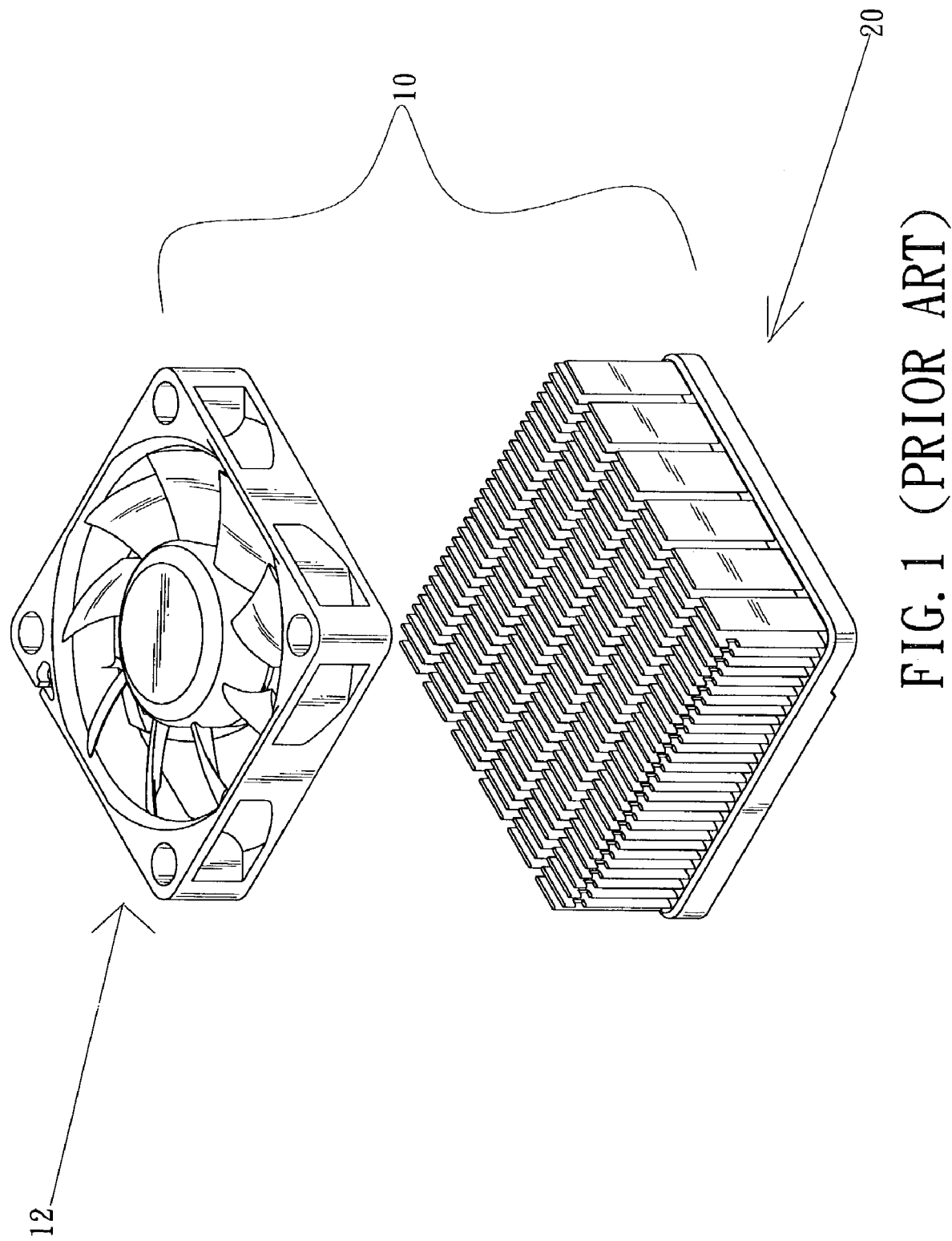
FIG. 1 is the schematic view of a conventional heat dissipating device.
Figure 2:
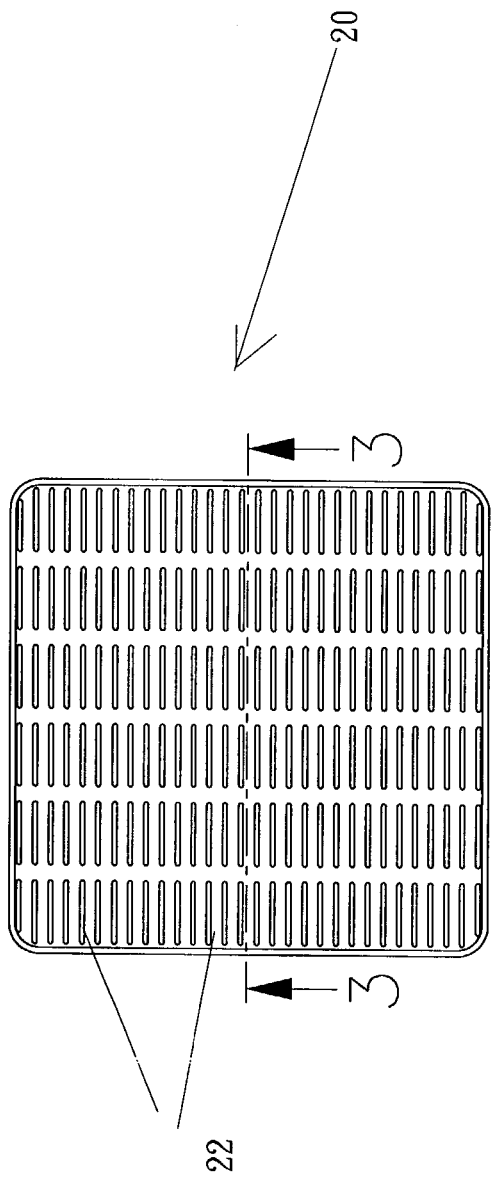
FIG. 2 is a top view of the planar heat sink in FIG. 1.
Figure 3:
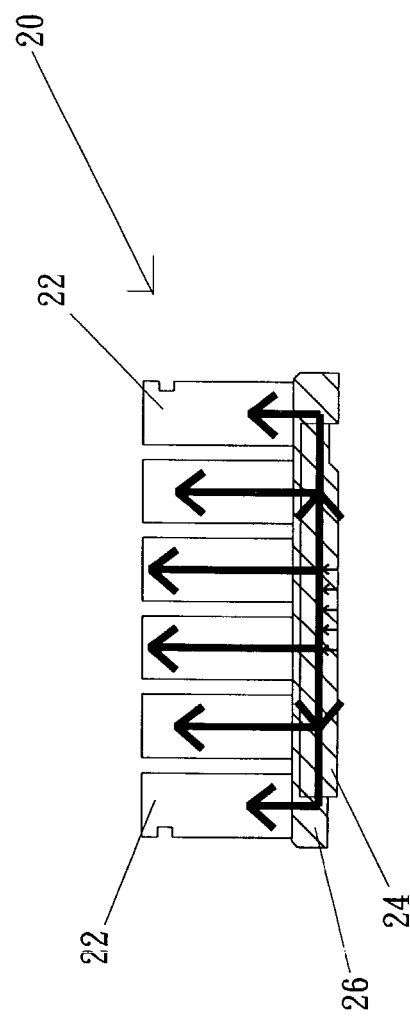
FIG. 3 is a side view of the planar heat sink along the cross section 3—3.
Figure 4:
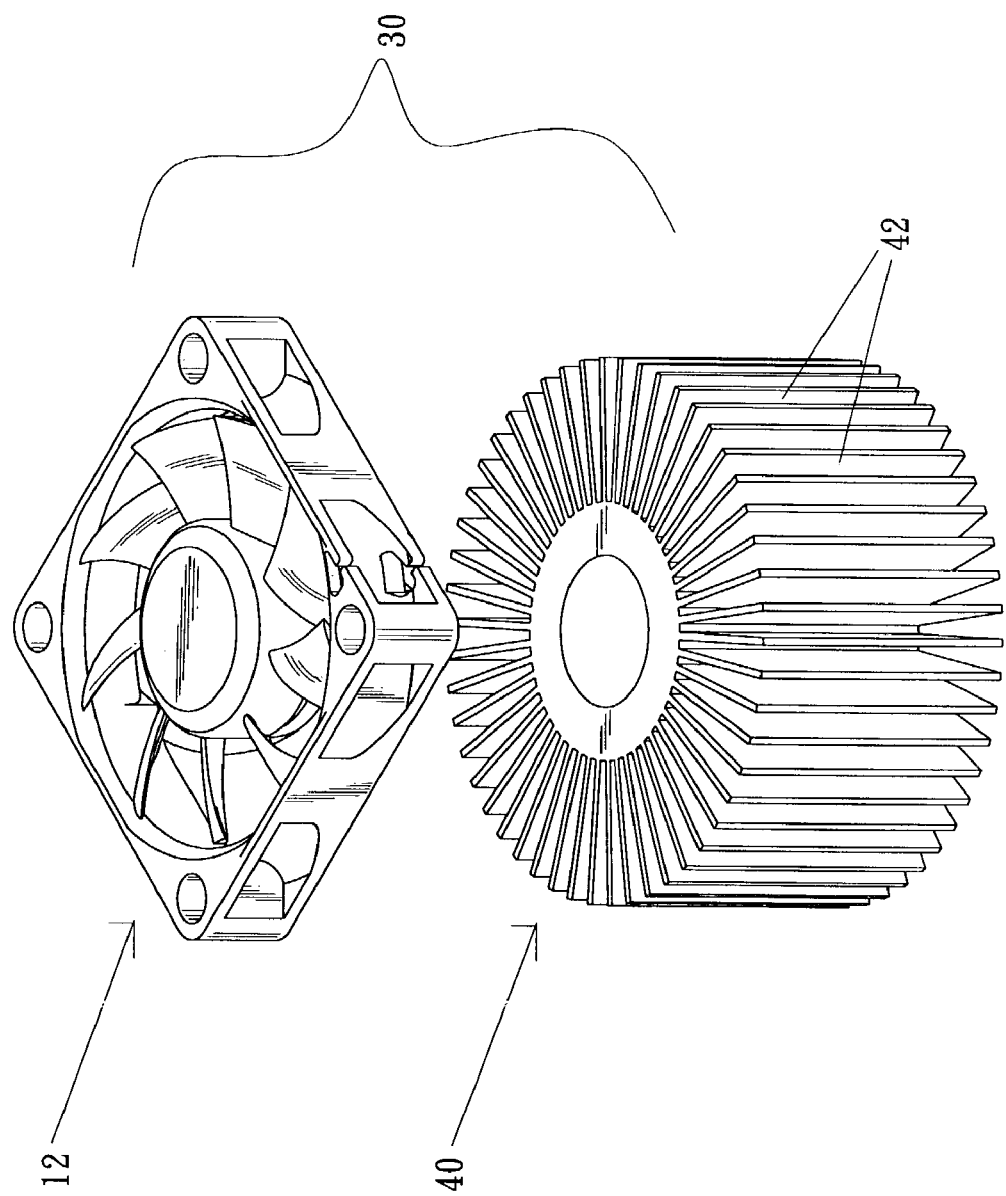
FIG. 4 is the schematic view of another conventional heat dissipating device.
Figure 5:
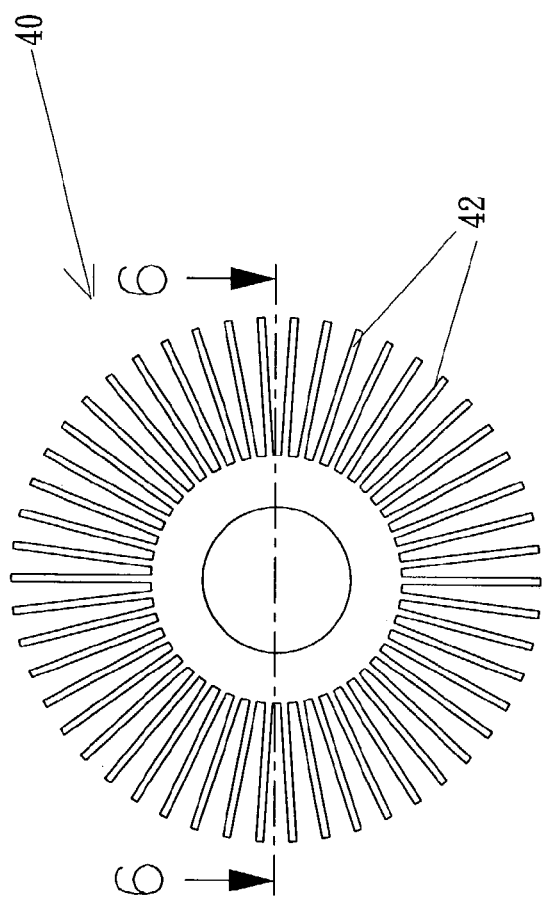
FIG. 5 is a top view of the cylindrical heat sink in FIG. 4.
Figure 6:
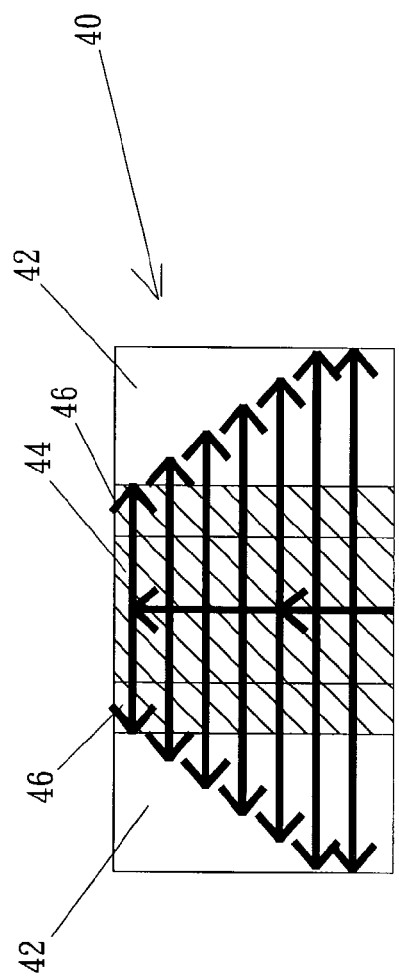
FIG. 6 is a side view of the cylindrical heat sink along the cross section 6—6.
Figure 7:
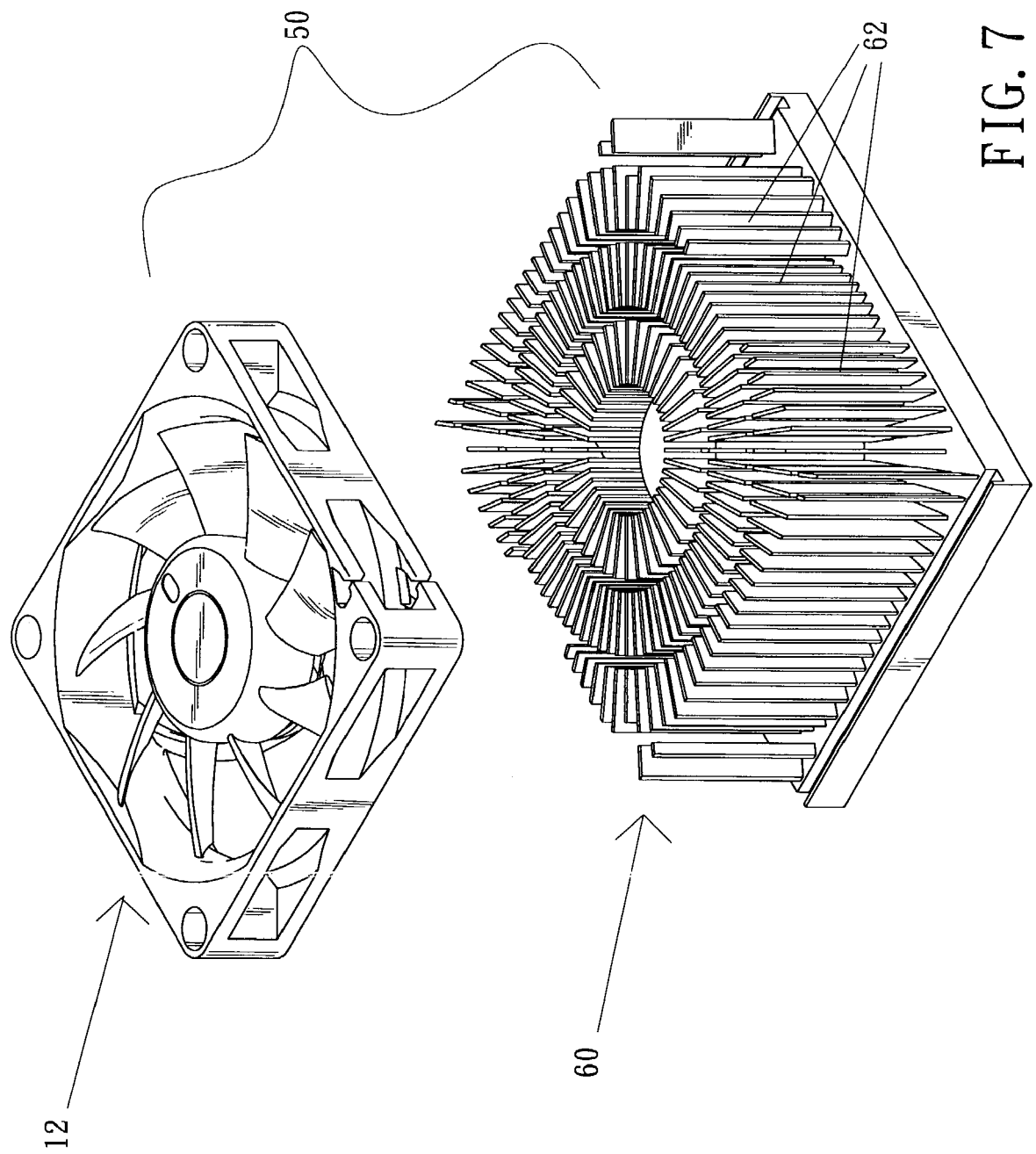
FIG. 7 is a schematic view of the disclosed heat dissipating device.
Figure 8:
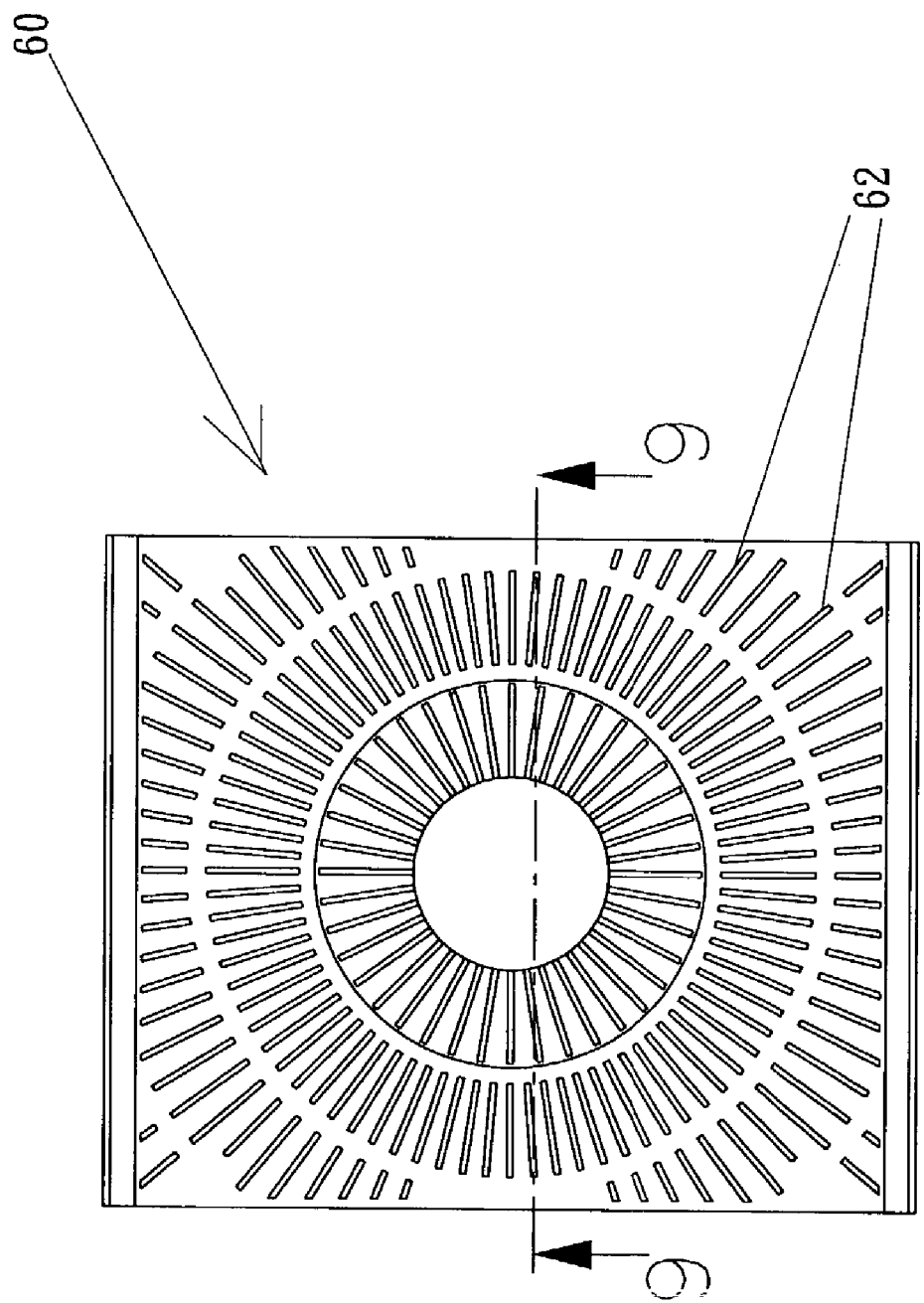
FIG. 8 is a top view of the heat sink in the first embodiment of the invention.
Figure 9:
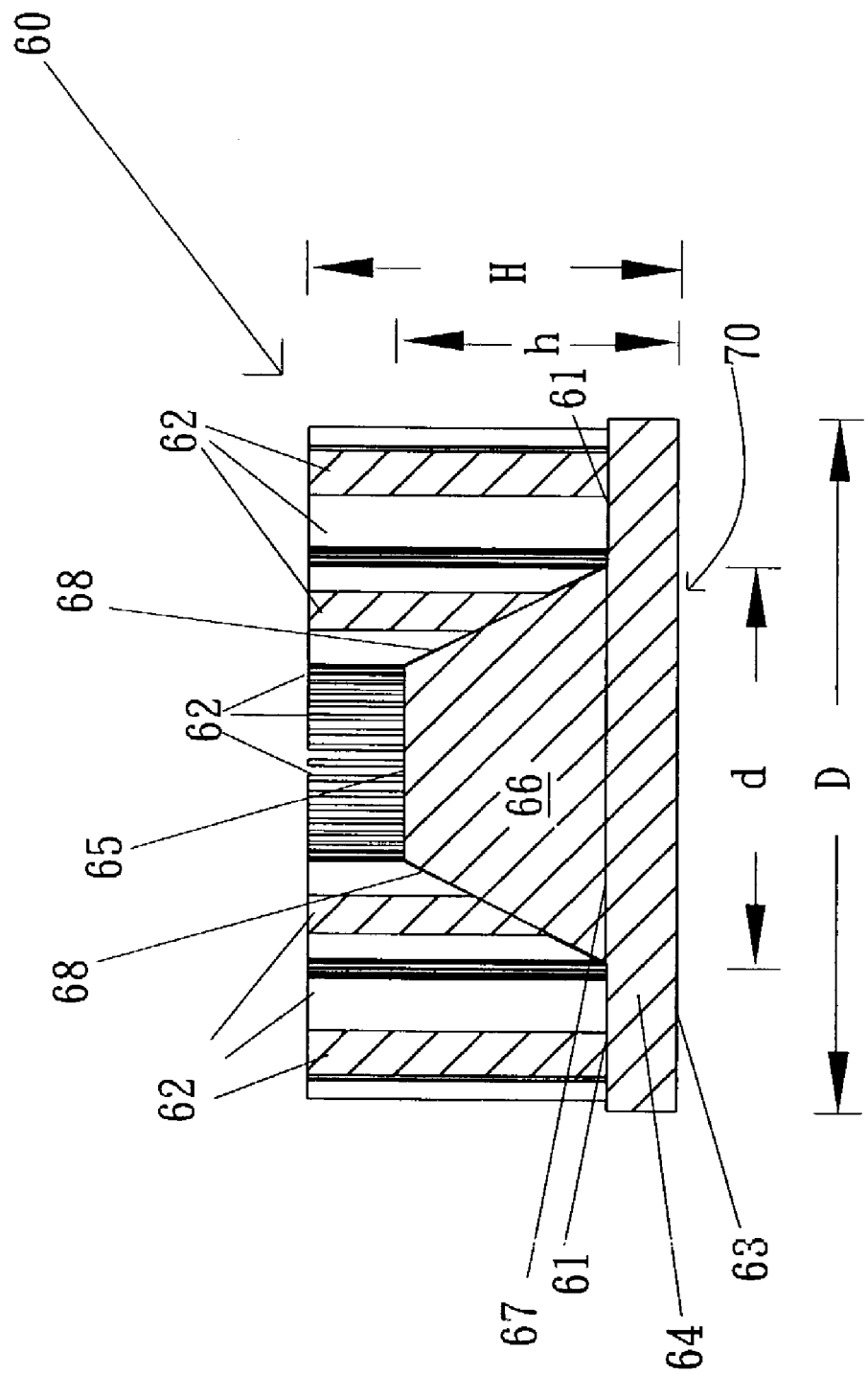
FIG. 9 is a side view of the heat sink in FIG. 8 along the cross section 9—9.

The disclosed heat sink is mounted on a heat-producing device, which can be a microprocessor or a central processing unit (CPU). As shown in FIGS. 7, 8 and 9, the heat dissipating device 50 of the invention contains an axial-flow fan 12 and a first improved heat sink 60. The heat sink 60 contains a heat dissipating base 70 with a three-dimensional curved surface and a plurality of heat dissipating fins 62. The base 70 contains a heat conductive plate 64 and a heat conductive block 66 installed at the center of the upper surface 61 of the heat conductive plate 64. The fins 62 are mounted perpendicular to the upper surface 61 of the heat conductive plate 64 and the side surface 68 of the heat conductive block 66. Since the fins 62 are installed along the side surface 68, they have different surface areas. The fan 12 can be fixed onto the heat sink 60 using four fixing elements (e.g. screws) on the fins 62 at the four corners.

It should be emphasized that the heat sink 60 in the first embodiment is featured in that: the heat conductive plate 64 of the heat dissipating base 70 is installed with an approximately cylindrical heat conductive block 66 on the top surface 61. That is, the lower surface area of the block 66 is greater than its upper surface area. The heat conductive block 66 and the heat conductive plate 64 are formed together using aluminum, aluminum alloys, copper, copper alloys that have high coefficient of thermal conduction to form a heat dissipating base 70 with a three-dimensional curved surface. The fins 62 on the heat dissipating base 70 are soldered or formed together with the heat dissipating base 70.

Figure 10A:
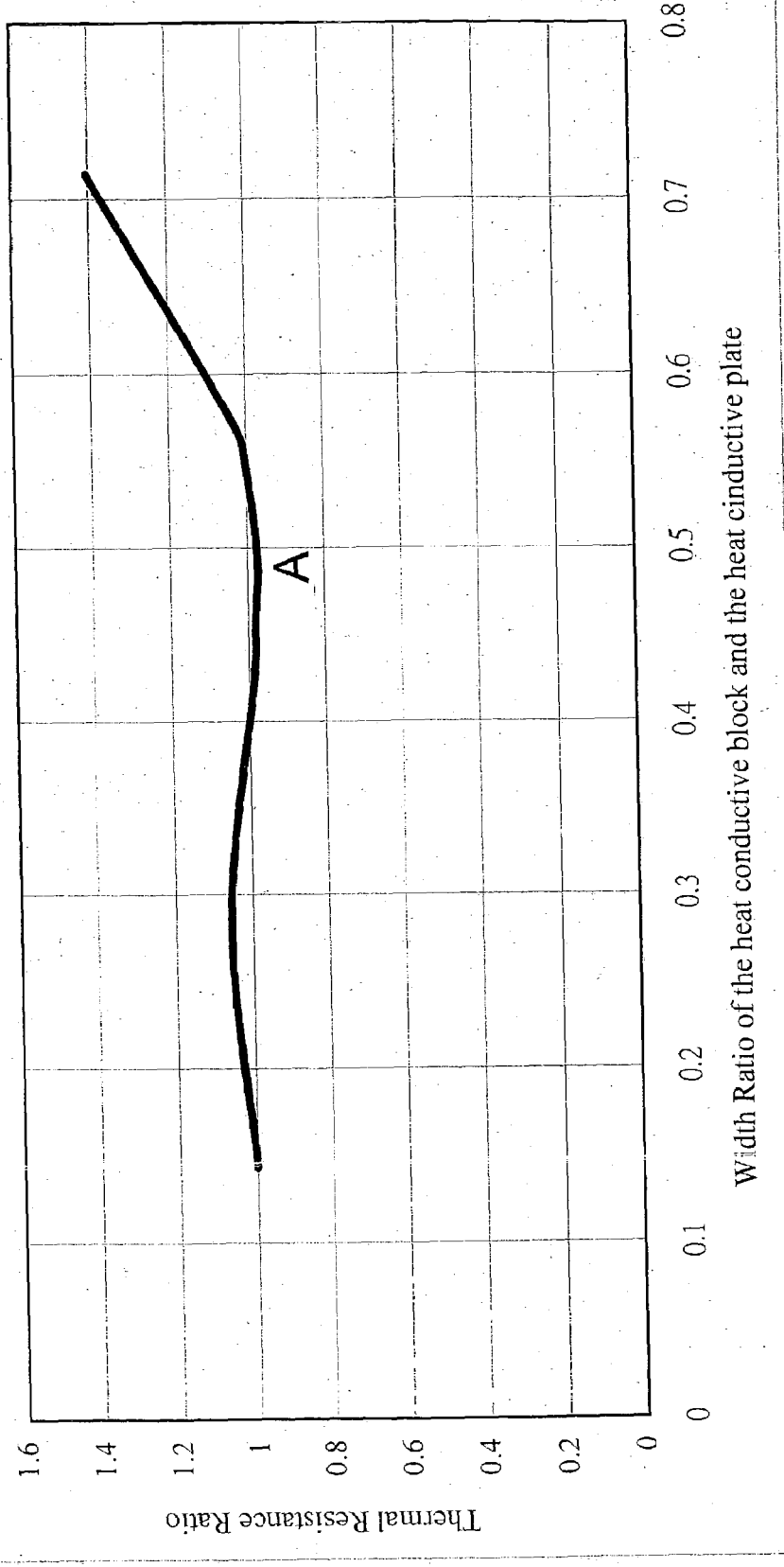
FIG. 10A shows the thermal resistance of the heat dissipating base as a function of the ratio of the cross section width of the lower surface of the heat conductive block and the cross section width of the heat conductive plate in the first embodiment of the invention.
Figure 10B:
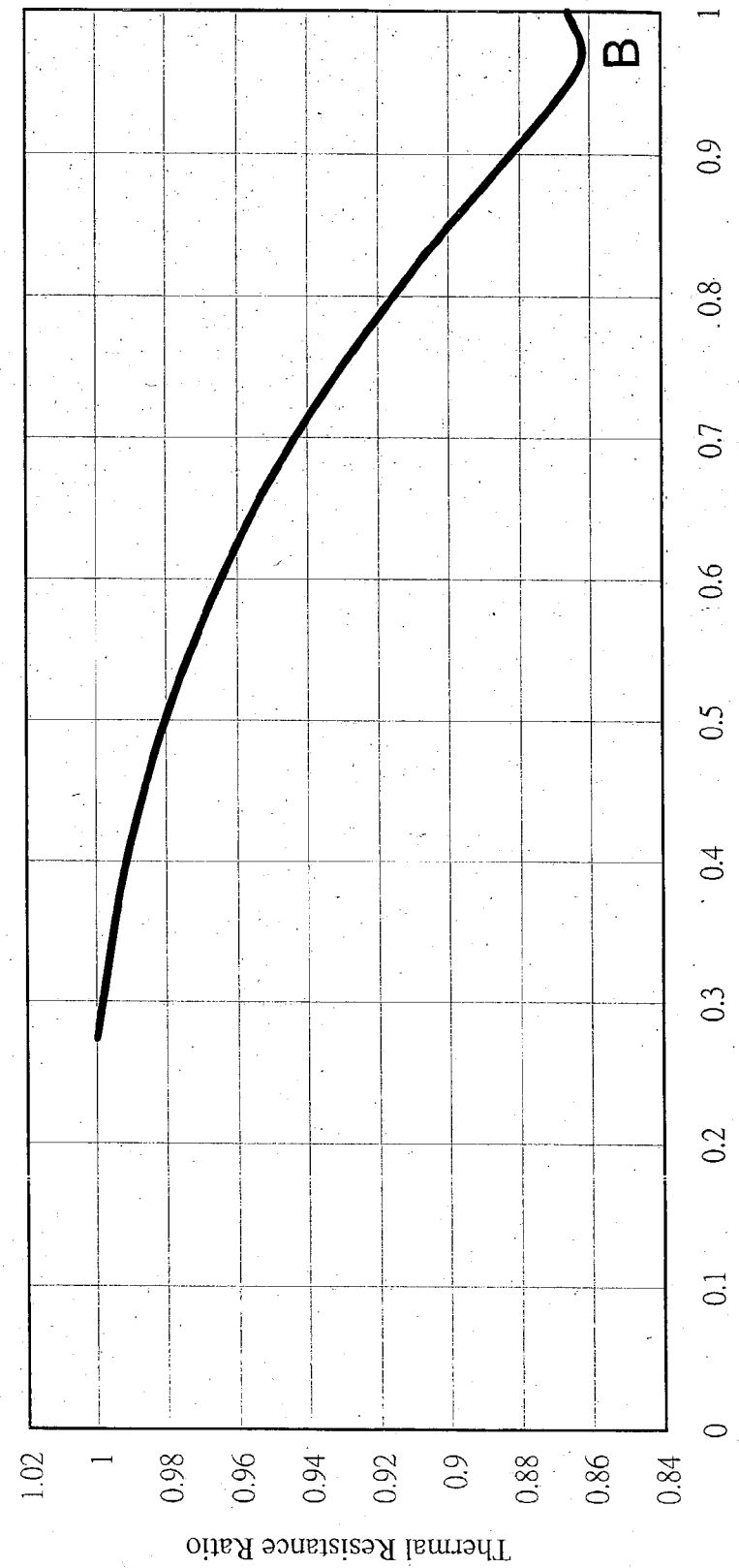
FIG. 10B shows the thermal resistance of the heat dissipating base as a function of the ratio of the vertical height of the heat dissipating base and the vertical height between the lower surface of the heat dissipating base and the top of fins in the first embodiment.
Figure 10C:
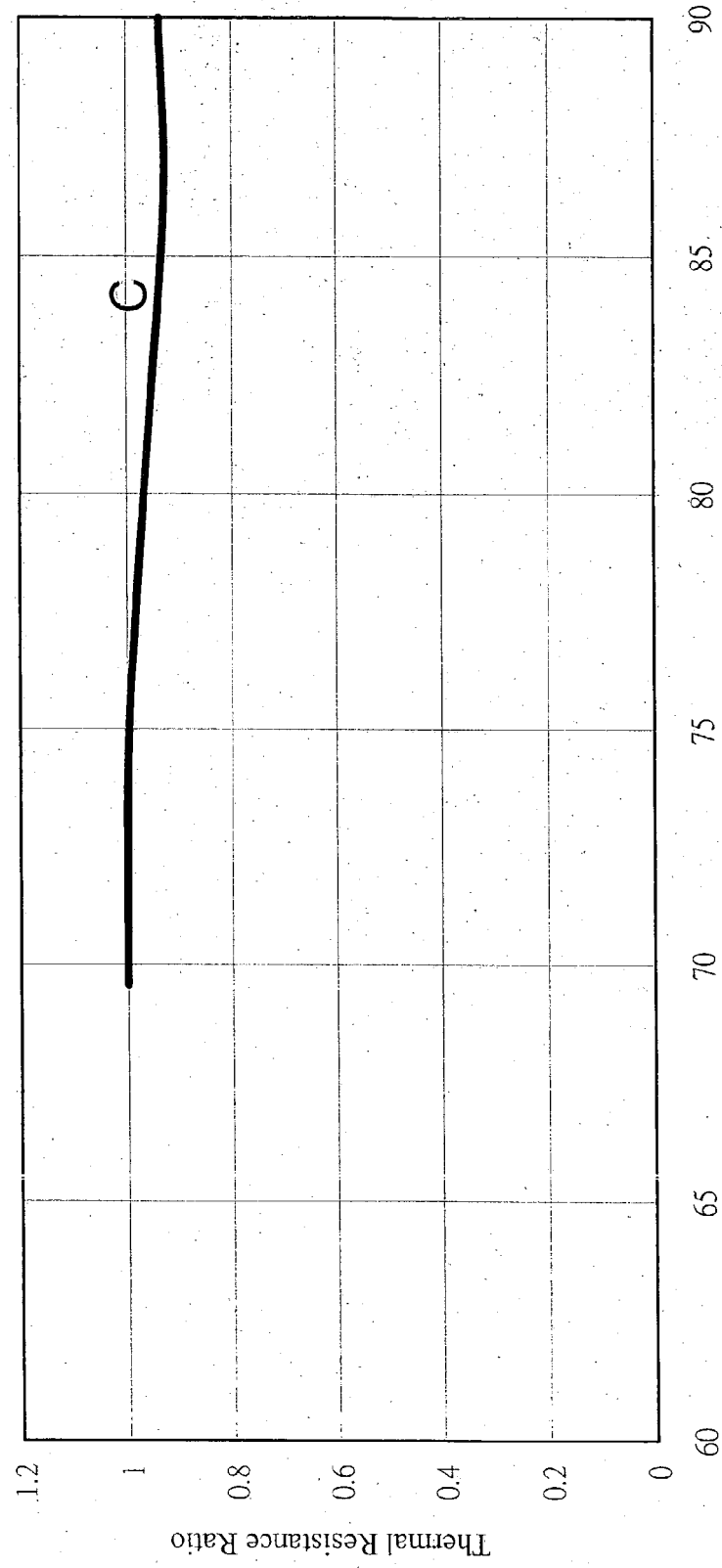
FIG. 10C shows the thermal resistance of the heat dissipating base as a function of the in the first embodiment.

The shape of the heat conductive block 66 is designed according to the heat flow field distribution inside the heat conductor and the coefficient of thermal conduction obtained in experiment. Here we only use simple texts and associated figures to describe the manufacturing and formation of the disclosed heat conductive block 66. Please refer to FIGS. 9, 10A, 10B and 10C. FIG. 10A shows the thermal resistance R of the heat dissipating base 70 as a function of the ratio d/D of the cross section width d of the lower surface of the heat conductive block 66 and the cross section width D of the heat conductive plate 64 in the first embodiment of the invention. FIG. 10B shows the thermal resistance R of the heat dissipating base 70 as a function of the ratio h/H of the vertical height h of the heat dissipating base 70 and the vertical height H between the lower surface 63 of the heat dissipating base 70 and the top of fins 62 in the first embodiment. FIG. 10C shows the thermal resistance R of the heat dissipating base 70 as a function of the angle α subtended between the lower surface 67 and the side surface 68 of the heat conductive block 66 in the first embodiment. Parameters that affect the design of the heat conductive block 66 include the cross section width D of the heat conductive plate 64, the cross section width d of the lower surface of the heat conductive block, the vertical height h of the heat dissipating base 70 (the total height of the heat conductive plate 64 and the heat conductive block 66), the vertical height H from the lower surface 63 of the heat dissipating base 70 to the top of the fins 62 (the total height of the heat conductive plate 64, the heat conductive block 66, and the fins 62), the angle α between the lower surface 67 and the side surface 68 of the heat conductive block 66, and the thermal resistance R of the heat dissipating base 70.

As shown in FIGS. 10A, 10B, and 10C, the heat conductive block 66 in the first embodiment has the following features: (1) The cross section width d of its lower surface is smaller than the cross section width D of the heat conductive plate 64. The heat dissipating base 70 reaches a minimum thermal resistance, point A in FIG. 10A, when the ratio d/D approaches 0.5. (2) The vertical height h of the heat dissipating base 70 is smaller than or equal to the vertical height H from the lower surface of the heat dissipating base 70 to the top of the fins 62; that is, the height of the heat conductive block is not larger than the height of each fin 62. When the ratio h/H is between 0.9 and 1.0, the heat dissipating base 70 has a minimum thermal resistance, point B in FIG. 10B. (3) The angle α between the lower surface 67 and the side surface 68 of the heat conductive block 66 is smaller than 90 degrees. In other words, the area of the lower surface 67 is greater than that of the upper surface 65. When α is between 80 degrees and 85 degrees, the heat dissipating base 70 reaches a minimum thermal resistance, point C in FIG. 10C.

When the lower surface 67 of the heat conductive plate 64 in the first embodiment is attached to a heat-producing device (not shown), the heat produced by the device can be transferred to each of the fins 62 through the disclosed heat conductive block 66. The axial-flow fan 12 then provides air convection to bring away the heat.

Figure 11:
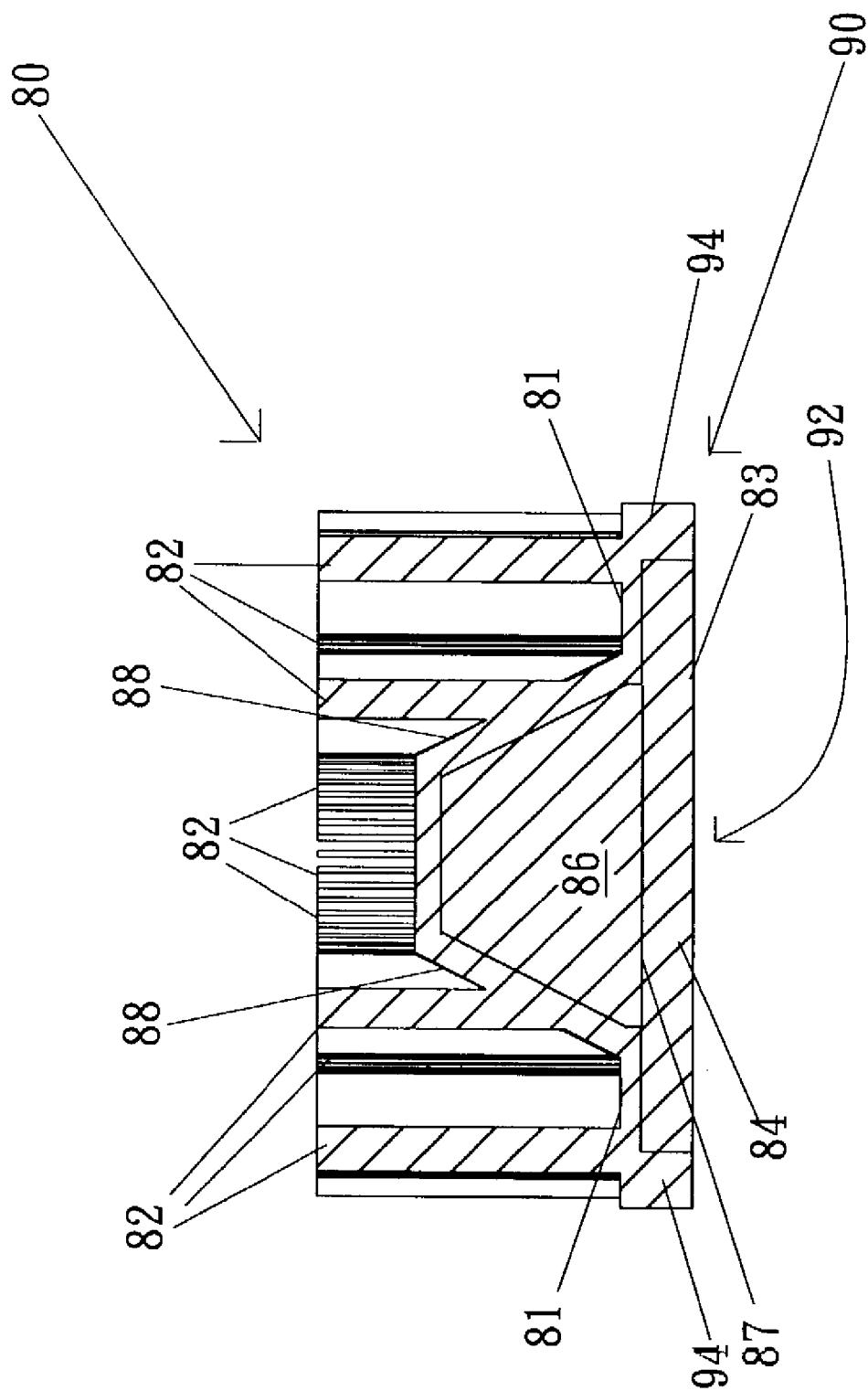
FIG. 11 is a side view of the heat sink in the second embodiment along the cross section 11—11.

FIG. 11 is a side view of the heat sink 80 in a second embodiment of the invention along the 11—11 cross section. The biggest difference between this heat sink 80 and the previous one 60 is that the current heat sink 80 contains a heat dissipating base 90 comprised of a heat conductive element 92 and a heat dissipating shell 94 covering over the heat conductive element 92. The heat dissipating shell 94 and the heat dissipating base 90 are made of different metal materials. For example, the heat conductive element 92 is made of copper and the heat dissipating shell 94 is made of aluminum. The heat dissipating fins 82 are formed together with the heat dissipating shell 94, and they are only formed on the upper surface 81 and side surface 88 of the heat dissipating shell 94. Otherwise, the heat conductive element 92 is similar to the heat dissipating base 70. It also has a heat conductive plate 84 and a heat conductive block 86 formed thereon. It should be mentioned that the size, shape, composition, and property of the heat conductive plate 84 and the heat conductive block 86 in the current embodiment are similar to those in the first embodiment. The only difference is that the three-dimensional curved surface of the heat conductive element 92 is covered by the thin piece of heat dissipating shell 94 by soldering or high-pressure mounting. The lower surface 83 of the heat conductive element 92 (i.e. the lower surface 83 of the heat conductive the parameters in designing the heat conductive block 86 are different from those in the first embodiment only in that the cross section width d is the width of the lower surface 87 of the heat conductive block 86 plus the widths of the heat dissipating shell 94 on both sides. Therefore, the shape of the heat conductive block 86 is particularly designed according to the heat flow field inside the heat conductor and the coefficient of thermal conduction obtained from experiments. The experimental results in the current embodiment are also similar to FIGS. 10A, 10B, and 10C and the heat dissipation effect is the same as in the first embodiment, so we do not repeat here.

Figure 12:
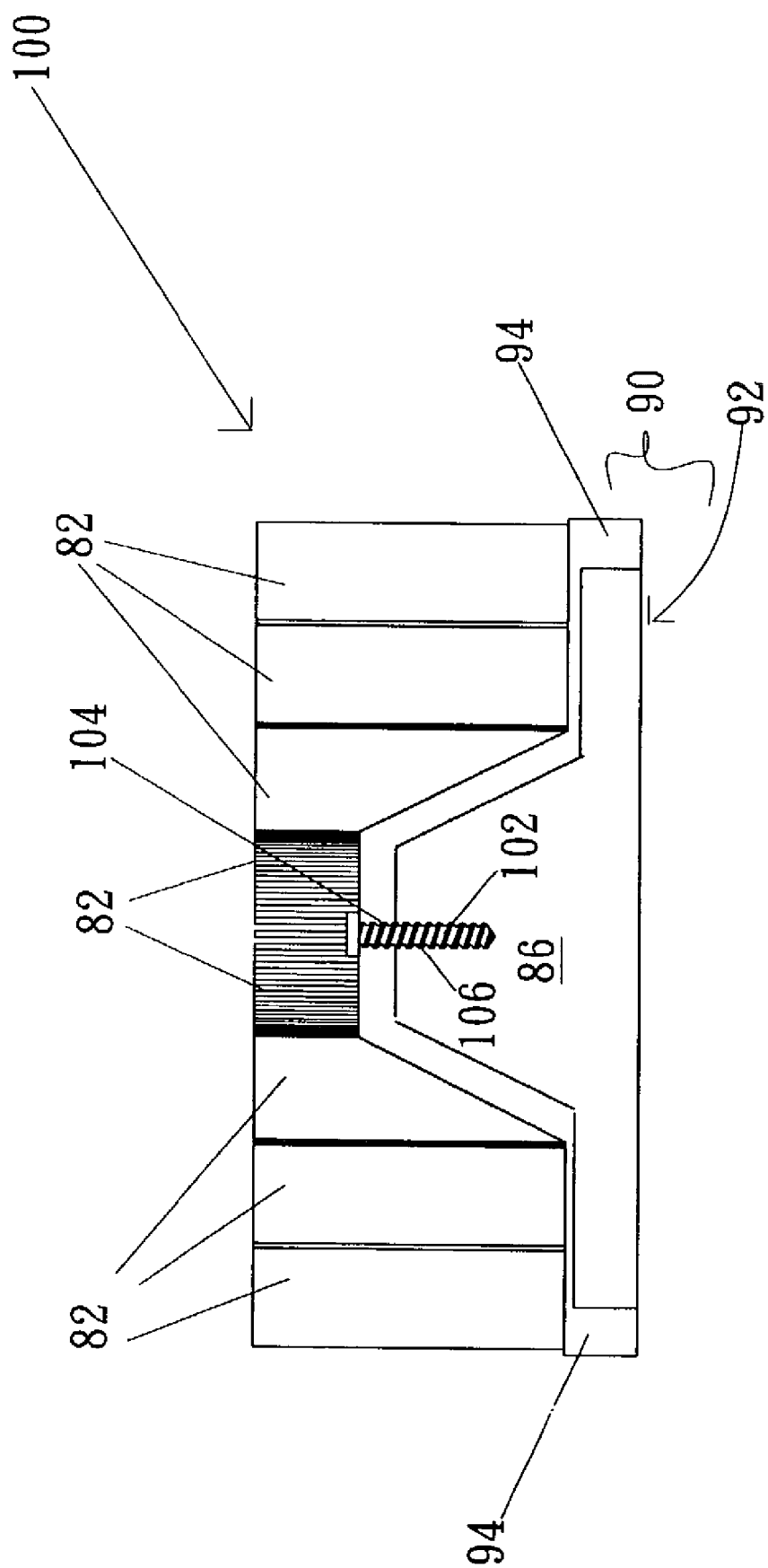
FIG. 12 is a side view of the heat sink in the third embodiment along the cross section 12—12.

With reference to FIG. 12, the composition and structure of the third embodiment of the heat sink 100 are the same as those of the heat sink 80. The only difference is that: the heat sink 100 has a screw 102 for connecting the heat dissipating shell 94 and the heat conductive block 86. The heat dissipating shell 94 has a through hole 104, and the heat conductive block 86 is formed with a trench 106 corresponding to and with the same diameter as the through hole 104. Another feature of the current embodiment is that when the heat conductive element 92 and the heat dissipating shell 94 are combined together, the screw 102 with a diameter slightly larger than those of the through hole 104 and the trench 106 is inserted into the through hole 104 of the heat dissipating shell 94. The screw 102 is rotated into the trench 106 on the heat conductive block 86 by hand or machine. The heat dissipating shell 94 is then tightly connected to the heat conductive element 92 through the screw 102. Therefore, it can avoid increase in thermal resistance due to the connection of two different metals by soldering.

It should be emphasized here that the side surface of the heat conductive block does not need to be a plane. It can be a smooth and curved surface. The fins can be made into other shapes that have larger heat dissipating areas. These modifications are still within the scope of the invention but not further described herein.

In comparison with the prior art, a distinct characteristic of the invention is that: all the heat sinks 60, 80, 100 in the embodiments of the invention have heat dissipating bases 70, 90 with a three-dimensional curved surface. They are designed according to the heat flow field inside the heat conductors and data of coefficient of thermal conduction obtained from experiments. Therefore, they solve the problems of inferior heat dissipation in the conventional planar and the cylindrical heat sinks. With the connecting element introduced in the third embodiment, the heat dissipation effect of the disclosed heat sink can be further improved.

What is claimed is:

1. A heat sink comprising:
    a heat dissipating base, which has a heat conductive element and a heat dissipating shell covering over the heat conductive element the heat conductive element including a heat conductive plate and a heat conductive block, the heat conductive plate and the heat conductive block being separately formed, the heat conductive plate having a top side and a bottom side, the heat conductive block having a flat top side and a flat bottom side, the flat bottom side of the heat conductive block being disposed at the top side of the heat conductive plate and on top of the center of the heat conductive plate, the bottom side of the heat conductive plate being in contact with a heat-producing device; and
    a plurality of heat dissipating fins, which is installed perpendicular to the flat top side of the heat conductive element, at least one of the plurality of heat dissipating fins being disposed on top of the flat top side of the heat conductive block;
    wherein the flat bottom side of the heat conductive block has a larger area than the flat top side of the heat conductive block.

2. The heat sink of claim 1, wherein the plurality of fins and the heat dissipating shell are made together at the same time using materials with high coefficients of thermal conduction selected from the group consisting of aluminum and aluminum alloys.

3. The heat sink of claim 1, wherein the flat top side and a sidewall of the heat conductive block are in direct contact with the heat dissipating shell, and the areas of the top and bottom sides of the heat conductive plate are larger than the areas of the flat top and flat bottom side of the heat conductive block.

4. The heat sink of claim 3, wherein the heat conductive plate and the heat conductive block of the heat conductive element are made of materials with high coefficients of thermal conduction selected from the group consisting of copper and copper alloys.

5. The heat sink of claim 3, wherein the fins installed on the heat dissipating shell other than the heat conductive block have a different surface area.

6. The heat sink of claim 3, wherein the height of the heat conductive block is not greater than the height of the fins on the heat dissipating shell.

7. The heat sink of claim 3, wherein the surface of the heat dissipating shell that is attached to the sidewall of the heat conductive block is a smooth curved surface.

8. The heat sink of claim 3, further comprising a connecting element, wherein the heat dissipating shell has a through hole, the heat conductive block is formed with a trench corresponding to the through hole, the connecting element has a diameter slightly larger than that of the trench, and the connecting element is inserted into the through hole and fixed inside the trench so that the heat dissipating shell is tightly connected to the heat conductive block.

9. The heat sink of claim 8, wherein the connecting element is a screw.

10. The heat sink of claim 8, wherein an axial-flow fan is installed over the fins.

11. A heat sink comprising:
    a heat dissipating base, which has a heat conductive plate and a heat conductive block, the heat conductive plate and the heat conductive block being separately formed, the heat conductive block having a flat top side, a sidewall and a bottom side, the bottom side of the heat conductive block being disposed on a top side of the heat conductive plate; and
    a plurality of heat dissipating fins disposed on and connected to the top side of the heat conductive plate and the flat top side of the heat conductive block;
    wherein the bottom side of the heat conductive block has a bigger area than the flat top side of the heat conductive block,
    wherein the heat dissipating base further has a heat dissipating shell covering over the heat conductive plate and the heat conductive block, and the heat dissipating fins are installed to the heat dissipating shell.

12. The heat sink of claim 11, wherein the top side of the heat dissipating shell is not flat.

13. The heat sink of claim 11, wherein the heat sink is for dissipating a heat-producing device and a bottom surface of the heat conductive plate is in direct contact with the heat-producing device.

* * * * *